(12) United States Patent
Pfaffinger et al.

(10) Patent No.: US 8,350,635 B2
(45) Date of Patent: Jan. 8, 2013

(54) SUPPRESSION OF HIGH-FREQUENCY PERTURBATIONS IN PULSE-WIDTH MODULATION

(75) Inventors: Gerhard Pfaffinger, Regensburg (DE); Arnold Knott, Huderdorf (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 1134 days.

(21) Appl. No.: 12/047,895

(22) Filed: Mar. 13, 2008

(65) Prior Publication Data

US 2008/0260018 A1    Oct. 23, 2008

(30) Foreign Application Priority Data

Mar. 15, 2007    (EP) ..................... 07005405

(51) Int. Cl.
*H03K 7/08*    (2006.01)
(52) U.S. Cl. ........................ 332/109; 375/238
(58) Field of Classification Search ............. 332/107, 332/109, 110; 375/238; 330/10, 251, 207 A; 323/282
See application file for complete search history.

(56) References Cited

U.S. PATENT DOCUMENTS

| 4,949,048 | A | 8/1990 | Tokumo et al. |
| 7,102,405 | B2 * | 9/2006 | Hisamoto et al. ............ 327/172 |
| 7,161,423 | B2 * | 1/2007 | Paul et al. ...................... 330/51 |
| 7,279,964 | B2 * | 10/2007 | Bolz et al. ...................... 330/10 |
| 2002/0190789 | A1 | 12/2002 | Morita |
| 2005/0156665 | A1 | 7/2005 | Maejima |

FOREIGN PATENT DOCUMENTS
WO    WO 00/07291    2/2000

OTHER PUBLICATIONS

Kolar, J. E. et al., "Novel Aspects of an Application of 'Zero'-Ripple Techniques to Basic Converter Topologies", *Power Electronics Specialists Conference*, 1, 1997, pp. 796-803.

* cited by examiner

*Primary Examiner* — Ryan Johnson
(74) *Attorney, Agent, or Firm* — O'Shea Getz P.C.

(57) ABSTRACT

A method suppresses high-frequency perturbations in a pulse-width modulated signal. The pulse-width modulation may superpose a carrier signal onto an input signal having a predetermined modulation frequency. The carrier signals may be phase-shifted. The resulting modulated signals may then be filtered and combined.

12 Claims, 5 Drawing Sheets

SUPPRESSION OF HIGH-FREQUENCY PERTURBATIONS IN PULSE-WIDTH MODULATION

FIELD OF INVENTION

1. Priority Claim

This application claims the benefit of priority from EP Application No. 07 005 405.1, filed Mar. 15, 2007, which is hereby incorporated by reference.

2. Technical Field

The present inventions relate to the technique of pulse-width modulation. In particular, the present inventions relate to a method of damping high-frequency perturbations.

BACKGROUND OF THE INVENTION

Pulse-width modulation (PWM) is a technique for controlling analog circuits with digital outputs of a microprocessor or with a discrete modulator. PWM is employed in a wide variety of applications, ranging from measurement and communications to power control and conversion.

PWM is used in the common "switch-mode" power supplies that convert AC power to DC for computers and other electronic devices. It can be used to control the speed of a DC motor, the brightness of a light bulb, or an output of audio amplifiers. Due to the discrete nature of the PWM output, PWM amplifiers may produce less heat than traditional analog amplifiers.

Pulse-width modulation of a signal or power source involves the modulation of its duty cycle to either convey information over a communication channel or control the amount of power sent to some loads. High-frequency perturbations from a carrier frequency used in the PWM and its harmonics may interfere with the recovery of information from the pulse-width modulated signal.

SUMMARY

A method suppresses high-frequency perturbations in a pulse-width modulated signal. The pulse-width modulation may superpose a carrier signal onto an input signal having a predetermined modulation frequency. The carrier signals may be phase-shifted. The resulting modulated signals may then be filtered and combined.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Some pulse-width modulation processes create inherent high-frequency perturbations from the carrier frequency and its harmonics in an information signal. Suppression of these high-frequency perturbations may produce cleaner data extracted from the modulated signal and improved electromagnetic compatibility in pulsed synchronized pulse-width modulating circuits. The systems may facilitate the suppression of the perturbations, thus increasing the efficiency and effectiveness of extracting clean data from a pulse-width modulated signal. The systems may enhance the quality of the output signal and improve electromagnetic compatibility in pulsed synchronized pulse-width modulating circuits. The perturbation suppression may occur through a phase difference of the used carrier signals that causes negative perturbations to be superposed on positive ones. Synchronized coupling of one in-phase clock (carrier) signal and the corresponding inverted signal (e.g. phase-shifted by 180°) or quadrature clock signal (e.g. phase-shifted by 90°) may result in an enhanced quality of the output signal.

Figure 1:
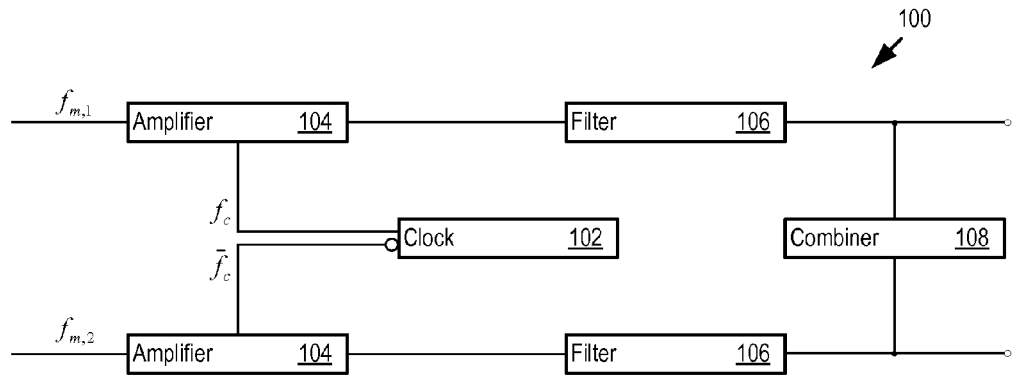
FIG. 1 is a high-frequency perturbation suppression system.

FIG. 1 shows a high-frequency perturbation suppression system 100. The suppression system 100 includes a clock 102, amplifiers 104, filters 106, and a combiner 108. The system 100 receives two input signals with a first modulation frequency $f_{m,1}$ and a second modulation frequency $f_{m,2}$. These input signals may be the same input signal with the same modulation frequency $f_{m,1}$. Alternatively, the system 100 may receive multiple, e.g. n, input signals. Each of the n input signals may have a single or its own modulation frequency.

The clock 102 may generate two carrier signals. One carrier signal has a carrier frequency of $f_c$. The second carrier signal has a carrier frequency of $\bar{f}_c$, indicating a carrier frequency that may be about 180° out of phase with the first carrier signal. Alternatively, the clock 102 may generate n carrier signals, where each of the n carrier signals is phase-shifted with respect to the others. Each of the n carrier signals may be phase shifted by about 360°/n with respect to a first carrier signal. For example, the clock 102 may generate four carrier signals, where three of the four carrier signals are phase-shifted by about 90°, 180°, and 270° with respect to the first carrier signal.

Each amplifier 104 receives an input signal and a carrier signal. The amplifier 104 may modulate the input signal using the carrier signal to produce a modulated signal. For example, the amplifier 104 may be a pulse-width modulation (PWM) amplifier. The PWM amplifier may superpose the input signal with the carrier signal to obtain a pulse-width modulated signal. Each filter 106 filters a modulated signal to obtain a perturbed filtered signal. The filter 106 may include a low-pass filter.

The combiner 108 sums each of the perturbed filtered signals from the filters 106 to obtain an enhanced output wanted signal. The combiner 108 may include a high-pass filter, an all-pass filter, or a combination of a high-pass and all-pass filter. Use of a high-pass filter may avoid affecting the wanted signal that has a significantly lower frequency than the carrier frequency and its harmonics.

Figure 2:
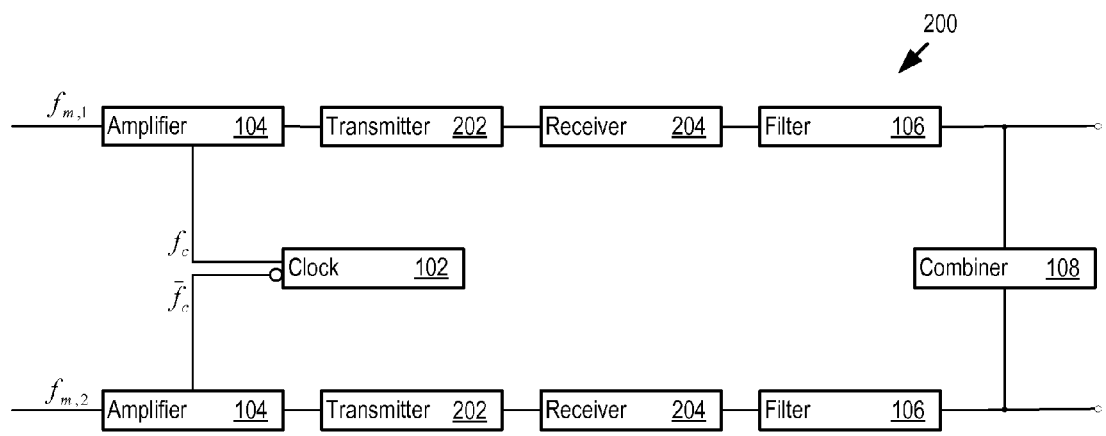
FIG. 2 is a second high-frequency perturbation suppression system.

FIG. 2 shows a second high-frequency perturbation suppression system 200. The system 200 includes the clock 102, the amplifiers 104, the filters 106, and the combiner 108. Additionally, the system 200 includes transmitters 202 and receivers 204. The transmitters 202 may send the modulated signals from the amplifiers 104 in one device to another device. The receivers 204 may provide modulated signals transmitted from another device to the filters 106. The modulated signals may be amplified by the transmitters 202 or receivers 204 as part of the transmission/reception process.

FIGS. 1 and 2 illustrate systems using two amplifiers 104, two filters 106, two transmitters 202, and two receivers 204. Alternative systems may include n amplifiers 104, n filters 106, n transmitters 202, and n receivers 204. Such systems may include an amplifier 104 for modulating each of the n input signals with each of the n carrier signals, a filter 106 for filtering each of the n pulse-width modulated signals, a transmitter 202 for sending each of the modulated signals, and a receiver 204 for receiving each of the modulated signals. Other systems may include fewer or one transmitter 202 and fewer or one receiver 204, where multiple modulated signals may be sent and/or received by a single transmitter 202 and/or receiver 204.

Figure 3:
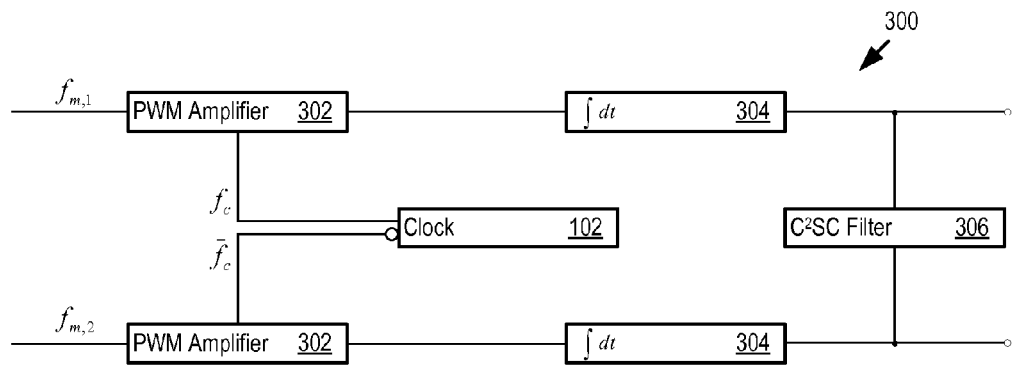
FIG. 3 is a third high-frequency perturbation suppression system.

FIG. 3 shows a third high-frequency perturbation suppression system 300. The system 300 includes the clock 102, as well as PWM amplifiers 302, integrators 304, and a $C^2SC$ filter 306. Like the amplifier 104, each PWM amplifier 302 receives an input signal and a carrier signal. The PWM amplifier 302 may modulate the input signal using the carrier signal to produce a pulse-width modulated signal. The PWM amplifier may be a class-D or switching amplifier.

In D amplifiers the output transistors are operated as switches. When a transistor is off, the current passing through it is zero; when it is on, the voltage across it is small, ideally zero. The power dissipation is very low. The input signal is converted to a sequence of pulses whose average value is directly proportional to the amplitude of the signal at that time.

The frequency of the pulses is typically ten or more times the highest frequency of interest in the input signal. The final switching output consists of a train of pulses whose width is a function of the amplitude and frequency of the signal being amplified. The output contains, in addition to the required amplified signal, unwanted spectral components (e.g. the pulse frequency and its harmonics) that may be removed by a passive filter. The filter may include lossless components like inductors and capacitors to maintain efficiency.

The PWM amplifiers 302 are controlled by the clock 102. The clock 102 generates a carrier frequency $f_c$ for carrier signals used for the PWM processing. The clock 102 also includes a phase shifter that shifts the phases of the carrier signals input to the PWM amplifiers 302 with respect to each other. A phase-shifted carrier signal may be a carrier signal with carrier frequency $\bar{f}_c$, where $\bar{f}_c$ is a carrier frequency phase-shifted by about 180° from the carrier frequency $f_c$. An input signal with a modulation frequency $f_{m,1}$ is received by one of the PWM amplifiers 302 and another input signal with a modulation frequency $f_{m,2}$ is received by another one of the PWM amplifiers 302. In the PWM amplifiers the carrier signals are superposed by the input signals.

The amplified PWM output signals are respectively processed by integrators 304. These integrators 304 may comprise low-pass filters. The outputs of the integrators 304 may represent signals comprising the amplified wanted signal and high-frequency perturbations due to the carrier signal and its harmonics. Suppression of the high-frequency perturbations may occur by destructive superposition of the perturbation portions of the filtered signals output by the integrators 304 by a $C^2SC$ filter 306. For a wanted signal that is pulse-width modulated by a PWM amplifier 302, an additional modulated signal with corresponding negative perturbations after the respective filtering of both signals may be added in the $C^2SC$ filter 306 to achieve cancellation of the high-frequency perturbations at frequencies of the carrier frequency and its harmonics.

A first perturbed modulated signal and a second perturbed modulated signal are combined by the $C^2SC$ filter 306 to obtain the enhanced output wanted signal. The $C^2SC$ filter 306 may comprise a high-pass filter of m-th order or a combination of a high-pass and an all-pass filter. The $C^2SC$ filter 306 may have a predetermined or required minimum damping rate, $\alpha$, for the highest frequency, $f_{max}$, present in the input signal (i.e. a pass band signal) and where the in equation holds $$l \geq \alpha/d \log(f_{max}/f_c)$$

for the length (order) of the $C^2SC$ filter 306, l, with $f_c$ and d denoting the carrier frequency of the carrier signals and the damping rate measured in units of dBμV/decade (damping per order). Numerical simulations have shown that employment of such a $C^2SC$ filter 306 results in a superior enhancement of the quality of the filtered (output) wanted signal.

Any low-pass filters in the integrators 304 and any high-pass or all-pass filters in the $C^2SC$ filter 306 may have identically decaying edges (flanks) for frequencies higher than the carrier frequency $f_c$. Such identical flanks may provide destructive superposition of the perturbation portions of the filtered signals.

Figure 4:
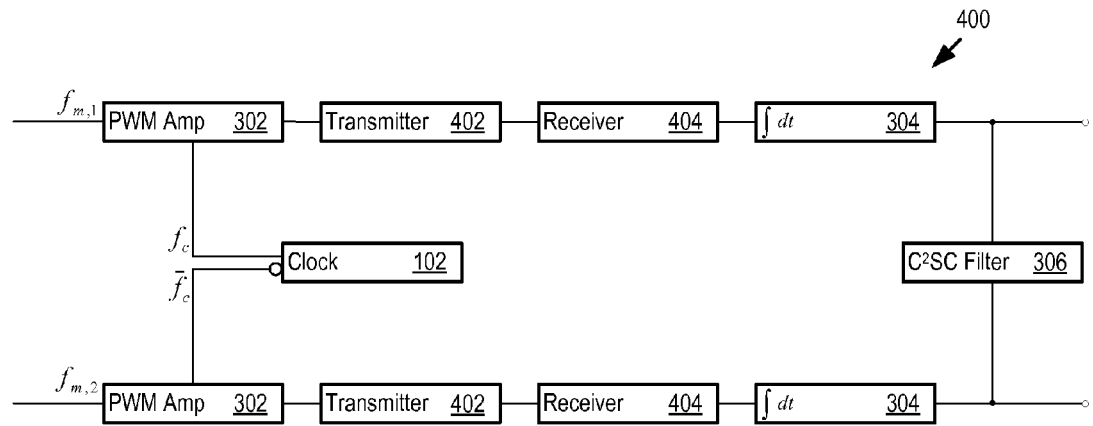
FIG. 4 is a fourth high-frequency perturbation suppression system.

FIG. 4 shows a fourth high-frequency perturbation suppression system 400. The system 400 includes the clock 102, the PWM amplifiers 302, the integrators 304, and the $C^2SC$ filter 306. Additionally, the system 400 includes transmitters 402 and receivers 404. The transmitters 402 may send the pulse-width modulated signals from the PWM amplifiers 302 in one device to another device. The receivers 404 may provide modulated signals transmitted from another device to the integrators 304. The modulated signals may be amplified by the transmitters 402 or receivers 404 as part of the transmission/reception process.

FIGS. 3 and 4 illustrate systems using two PWM amplifiers 302, two integrators 304, two transmitters 402, and two receivers 404. Alternative systems may include n PWM amplifiers 302, n integrators 304, n transmitters 402, and n receivers 404. Such systems may include a PWM amplifier 302 for modulating each of the n input signals with each of the n carrier signals, an integrator 304 for filtering each of the n pulse-width modulated signals, a transmitter 402 for sending each of the modulated signals, and a receiver 404 for receiving each of the modulated signals. Other systems may include fewer or one transmitter 402 and fewer or one receiver 404, where multiple modulated signals may be sent and/or received by a single transmitter 402 and/or receiver 404.

Figure 5:
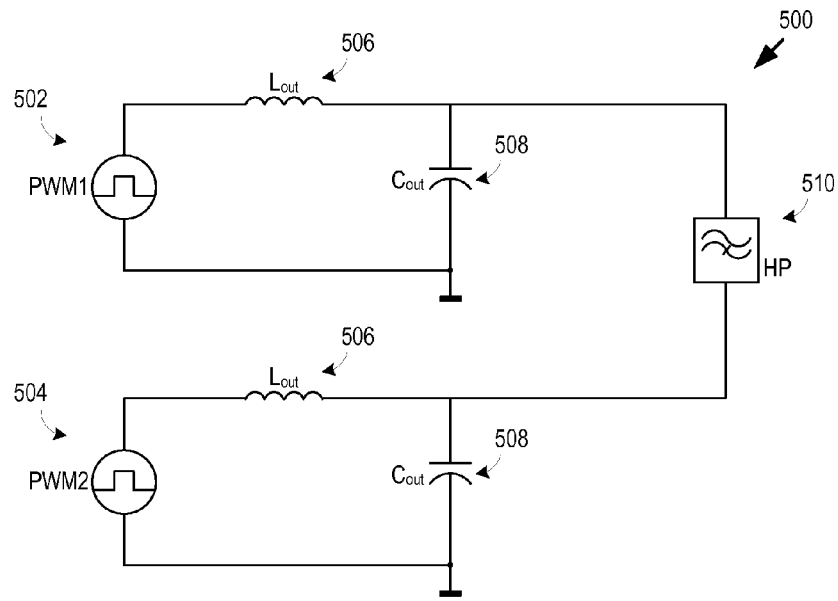
FIG. 5 is a C²SC filter with a high-pass filter.

FIG. 5 is a circuit 500 of a $C^2SC$ filter 306. The circuit 500 includes clock rate processors 502 and 504, output inductances 506, output capacitors 508, and a high-pass filter 510. The clock rate processors 502 and 504 achieve synchronized pulsed coupling of the filtered signals output by the integrators 304. The clock rate processors 502 and 504 may be pulse-width modulators based on the carrier frequencies $f_c$ and $\bar{f}_c$. The output inductances 506, output capacitors 508, and the high-pass filter 510 perform summation of the filtered signals output by the integrators 304 that exhibit opposite phases.

Figure 6:
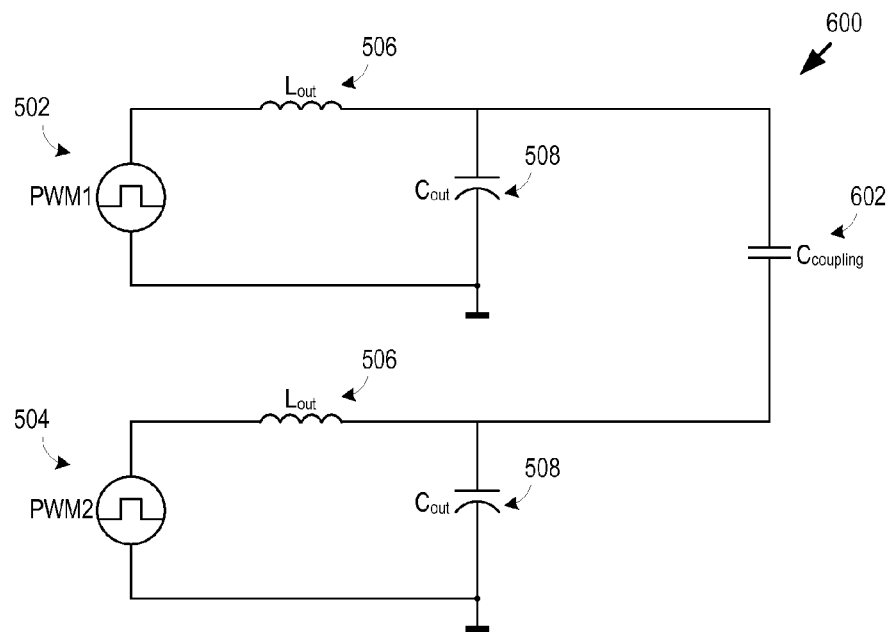
FIG. 6 is a C²SC filter with a coupling capacitor.

FIG. 6 is an alternative circuit 600 of a C²SC filter 306. The circuit 600 includes clock rate processors 502 and 504, output inductances 506, output capacitors 508, and a coupling capacitor 602. The output inductances 506, output capacitors 508, and the coupling capacitor 602 perform summation of the filtered signals output by the integrators 304 that exhibit opposite phases.

Figure 7:
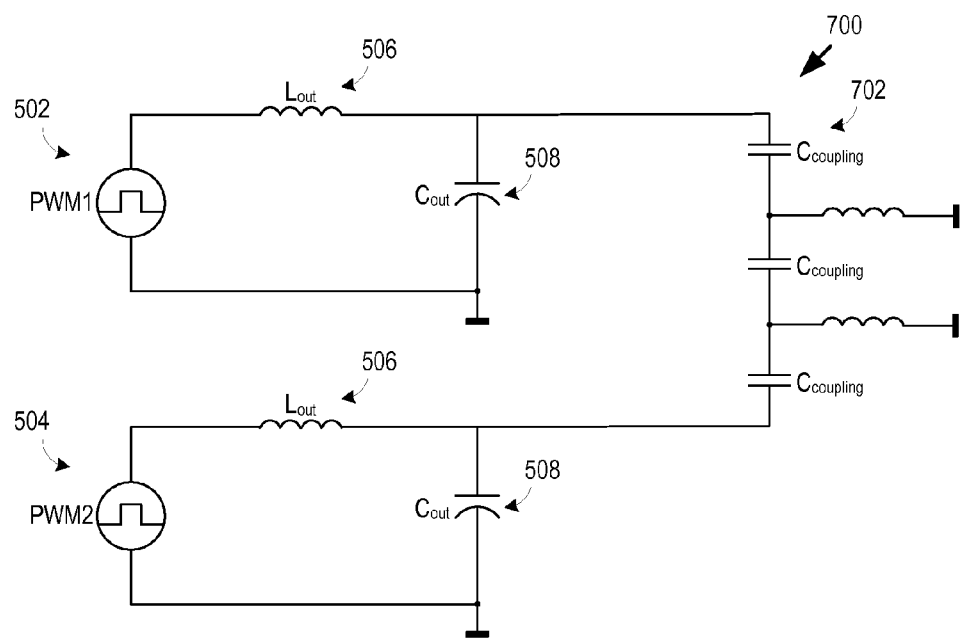
FIG. 7 is a C²SC filter with multiple coupling capacitors.

FIG. 7 is an alternative circuit 700 of a C²SC filter 306 comprising couplings capacitors. The circuit 700 includes clock rate processors 502 and 504, output inductances 506, output capacitors 508, and couplings capacitors 702. The output inductances 506, output capacitors 508, and the couplings capacitors 702 perform summation of the filtered signals output by the integrators 304 that exhibit opposite phases. The coupling capacitors 702 may include capacitors in series where the adjoining terminals of the capacitors are connected to ground through inductors.

Figure 8:
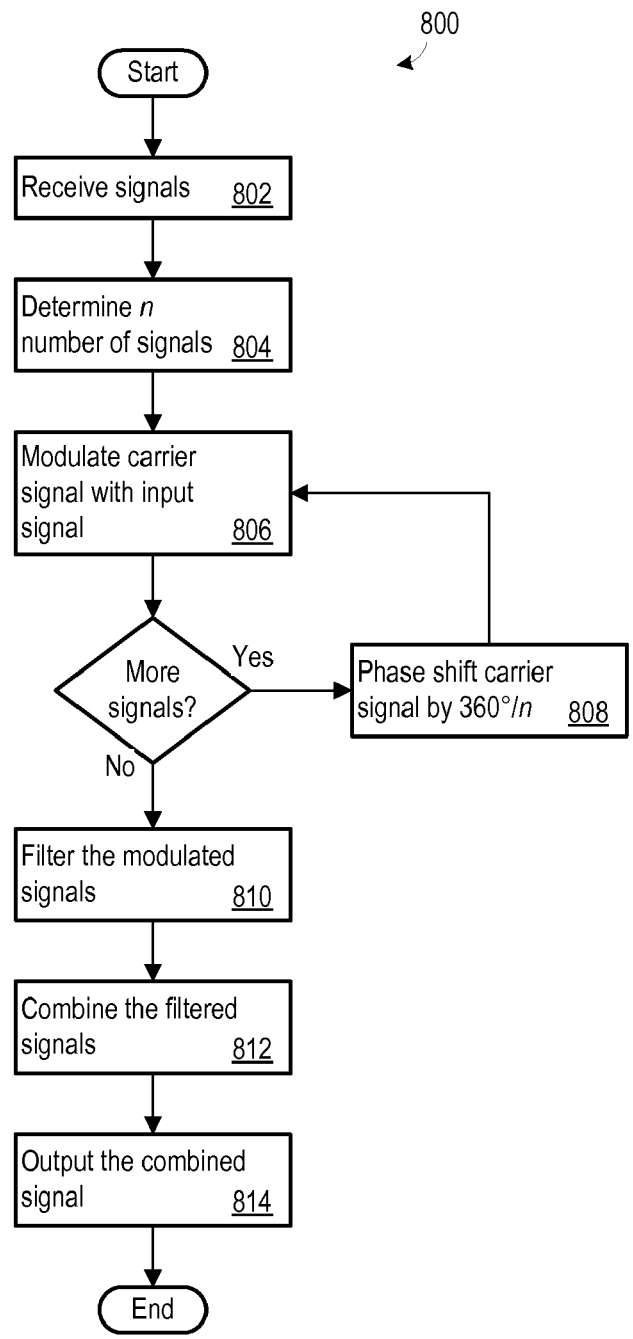
FIG. 8 is a flow diagram of high-frequency perturbation suppression process.

FIG. 8 is a high-frequency perturbation suppression process 800. The process 800 obtains a set of signals (802). The set of signals may include input signals and a carrier signal. One of the input signals may have a first modulation frequency $f_{m,1}$ and a second input signal may have a second modulation frequency $f_{m,2}$. These input signals may be the same input signal with the same modulation frequency $f_{m,1}$. Alternatively, the process 800 may receive multiple, e.g. n, input signals. Some or all of the n input signals may share a single modulation frequency, or some or all may possess their own modulation frequency. The process 800 may determine the number n of input signals (804) before modulating the carrier signal with one of the input signals (806). For example, the process 800 may superpose the carrier signal with the input signal having the first modulation frequency $f_{m,1}$ to produce a first modulated signal.

The process 800 may then determine whether more input signals are received. Where more input signals need to be processed, the process 800 phase-shifts the carrier signal (808) before modulating the phase-shifted carrier signal with the next input signal (806). This process may be repeated until all of the n input signals have been modulated with phase-shifted carrier signals to obtain n modulated signals.

For example, one of the carrier signals may have a carrier frequency of $f_c$. A second carrier signal may have a carrier frequency of $\bar{f}_c$, indicating a carrier frequency about 180° out of phase with the first carrier signal. Alternatively, the process 800 may generate n carrier signals for each of the n input signals, where each of the n carrier signals is phase-shifted with respect to the others. Each of the n carrier signals may be phase shifted by about 360°/n with respect to other carrier signals. For example, the process 800 may receive four carrier signals, where three of the four carrier signals are phase-shifted by about 90°, 180°, and 270° with respect to the first carrier signal.

Once the input signals have been modulated with the carrier signals, the process 800 filters the n modulated signals (810). This filtering process may produce perturbed filtered signals. The process 800 may use a low-pass filter.

The process 800 may then combine the filtered signals (812). The process 800 may sum each of the perturbed filtered signals to obtain an enhanced output wanted signal. The process 800 may use a high-pass filter, an all-pass filter, or a combination of a high-pass and all-pass filter to perform the combining. Use of a high-pass filter may not affect the wanted signal that has a significantly lower frequency than the carrier frequency and its harmonics. The process 800 may then transmit the enhanced output wanted signal (814).

Figure 9:
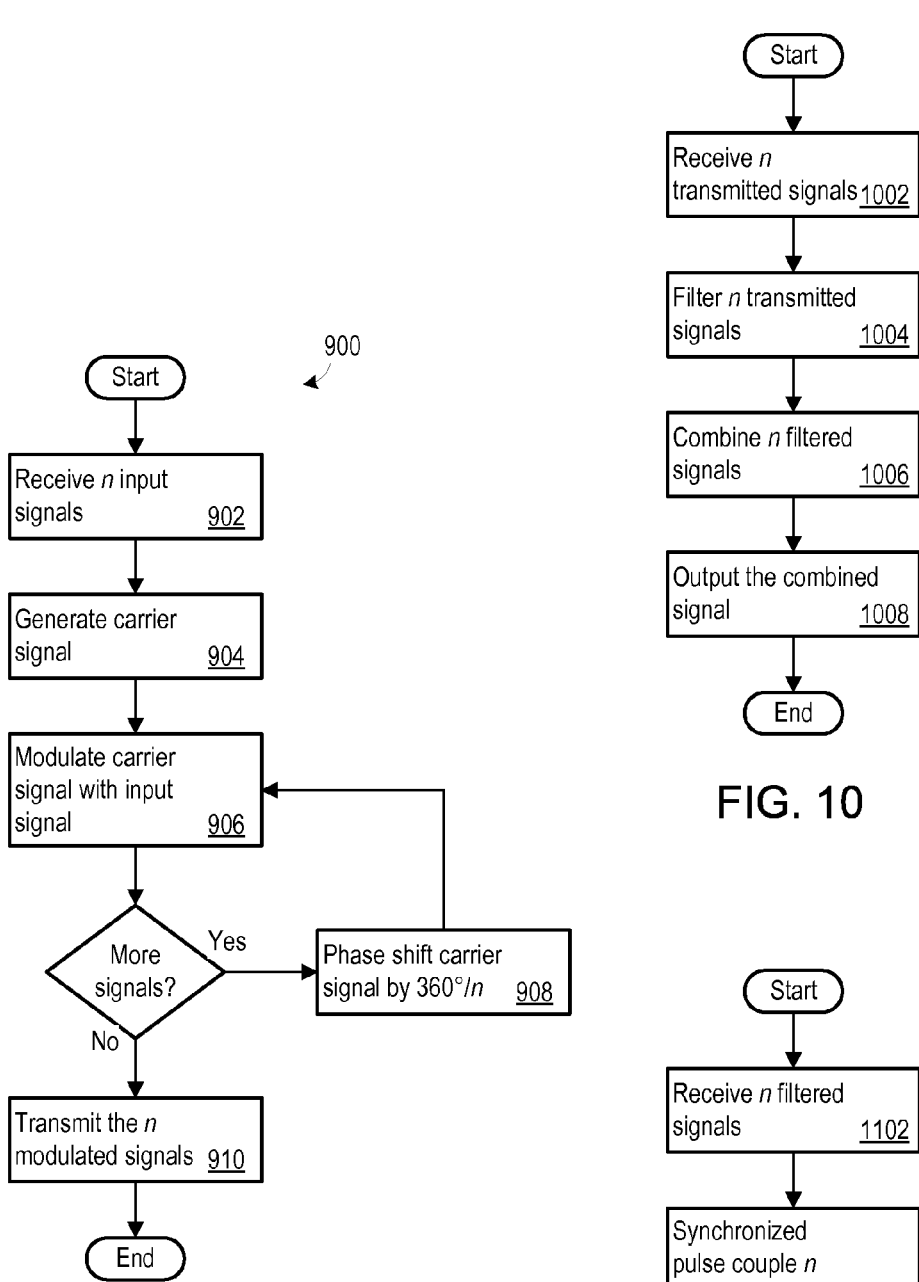
FIG. 9 is a flow diagram of a transmission portion of a high-frequency perturbation suppression process.

FIG. 9 is a transmitting portion of a high-frequency perturbation suppression process 900 (that may be performed, e.g., by system 200). The process 900 receives n input signals (902). One of the input signals may have a first modulation frequency $f_{m,1}$, and a second input signal may have a second modulation frequency $f_{m,2}$. The nth input signal may have an nth modulation frequency $f_{m,n}$. Some or all of the n input signals may share a single modulation frequency such as $f_{m,1}$, or some or all may possess their own modulation frequency.

The process 900 generates a carrier signal (904). The carrier signal may be a clock signal with a carrier frequency of $f_c$. The process 900 modulates a first input signal with the carrier signal (906). For example, the process 900 may superpose the carrier signal with the input signal having the first modulation frequency $f_{m,1}$ to produce a first modulated signal. The process 900 may perform the superposition using a pulse-width modulation amplifier.

The process 900 then determines whether more input signals are available to be processed. Where more input signals are available to be processed, the process 900 phase-shifts the carrier signal (908) before modulating the phase-shifted carrier signal with the next input signal (906). These actions may be repeated until all of the n input signals have been modulated with phase-shifted carrier signals to obtain n modulated signals. The n modulated signals are then transmitted (910).

Figure 10:
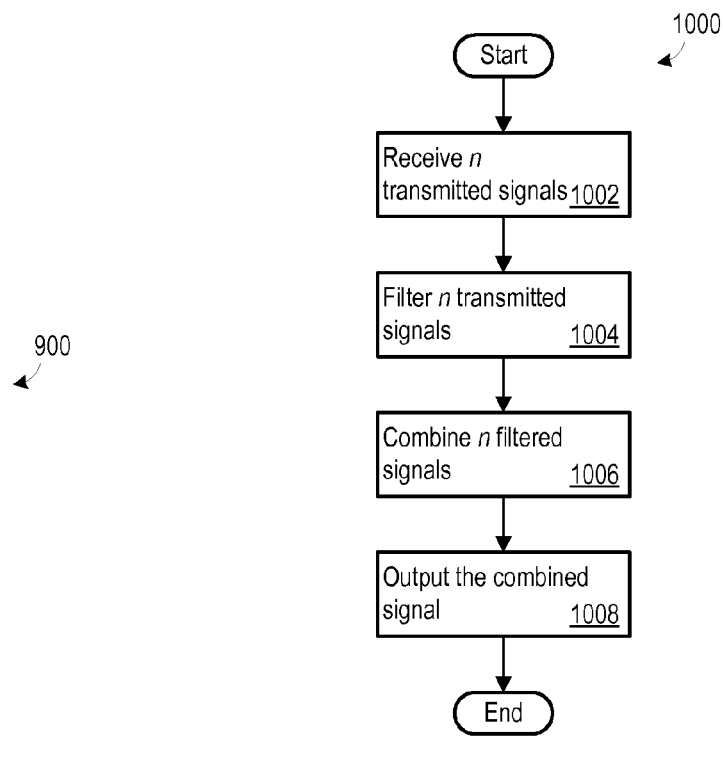
FIG. 10 is a flow diagram of a receiving portion of a high-frequency perturbation suppression process.

FIG. 10 is a receiving portion of a high-frequency perturbation suppression process 1000 (that may be performed, e.g., by system 200). The process 1000 may obtain n transmitted signals (1002). Those n received signals are then filtered (1004). The filtering may be performed by an integrator. Alternatively, the filtering may be performed using low-pass filters.

The process 1000 combines the n filtered signals to obtain an enhanced output wanted signal (1006). The n filtered signals may be combined by a C²SC filter to obtain the enhanced output wanted signal. The C²SC filter may include a high-pass filter of m-th order or a combination of a high-pass and an all-pass filter. The C²SC filter may have a predetermined or required minimum damping rate, α, for the highest frequency, $f_{max}$, present in the input signal (e.g. a pass band signal) and where the in equation holds $$l \geq \alpha/d \log(f_{max}/f_c)$$

for the length (order) of the C²SC filter, l, with $f_c$ and d denoting the carrier frequency of the carrier signals and the damping rate measured in units of dBμV/decade (damping per order). Any low-pass filters used in the filtering 1004 and any high-pass or all-pass filters in the C²SC filtering 1006 may have identically decaying edges (flanks) for frequencies higher than the carrier frequency $f_c$. Such identical flanks may provide destructive superposition of the perturbation portions of the filtered signals. The process 1000 may then output the enhanced output wanted signal (1008).

Figure 11:
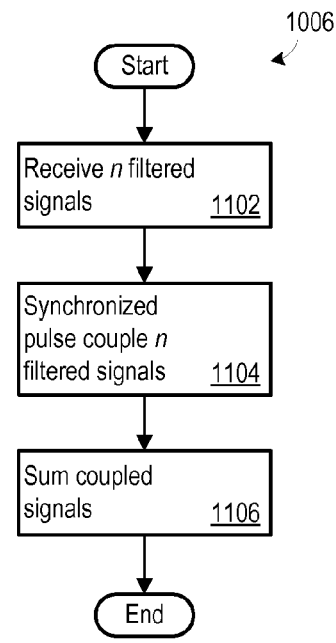
FIG. 11 is a flow diagram of combining filtered signals.

FIG. 11 shows a process for combining n filtered signals 1006. The process 1006 receives the filtered signals (1102). The process 1006 then synchronized pulse couples the filtered signals (1104). One or more clock rate processors may perform the synchronized pulsed coupling of the filtered signals. The clock rate processors may be pulse-width modulators based on the carrier frequencies, e.g., $f_c$ and $\bar{f}_c$, of the carrier signals. The process 1006 then sums the n synchronized pulse coupled signals (1106). One or more output inductances, output capacitors, and high-pass filters, all-pass filters, coupling capacitors, and/or coupling inductances may perform summation of the filtered signals output that exhibit opposite phases.

The methods and descriptions of FIGS. 8 through 11 may be encoded in a signal bearing medium, a computer readable medium such as a memory that may comprise unitary or separate logic, programmed within a device such as one or more integrated circuits, or processed by a controller or a computer. If the methods are performed by software, the software or logic may reside in a memory resident to or interfaced to one or more processors or controllers, a wireless communication interface, a wireless system, an entertainment and/or comfort controller of a vehicle or types of non-volatile or volatile memory remote from or resident to a detector. The memory may retain an ordered listing of executable instructions for implementing logical functions. A logical function may be implemented through digital circuitry, through source code, through analog circuitry, or through an analog source such as through an analog electrical, or audio signals. The software may be embodied in any computer-readable medium or signal-bearing medium, for use by, or in connection with an instruction executable system, apparatus, or device. The instruction executable system, apparatus, or device may be resident to a vehicle or a hands-free system communication system or audio system. Alternatively, the software may be embodied in media players (including portable media players) and/or recorders, audio visual or public address systems, desktop computing systems, etc. Such a system may include a computer-based system, a processor-containing system that includes an input and output interface that may communicate with an automotive or wireless communication bus through any hardwired or wireless automotive communication protocol or other hardwired or wireless communication protocols to a local or remote destination or server.

A computer-readable medium, machine-readable medium, propagated-signal medium, and/or signal-bearing medium may comprise any medium that contains, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical or tangible connection having one or more wires, a portable magnetic or optical disk, a volatile memory such as a Random Access Memory "RAM" (electronic), a Read-Only Memory "ROM," an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled by a controller, and/or interpreted or otherwise processed. The processed medium may then be stored in a local or remote computer and/or machine memory.

The system may provide a multi-channel sound amplification means, in particular, 9-channel amplification means, comprising the circuitry according to one of the above examples. The circuitry according to one of the above examples may be part of a device or structure for transporting a person or thing, such as a vehicle. The circuitry may be used in a vehicle amplification system including audio, navigation, communication, or on-board entertainment and comfort devices.

Other alternate systems include combinations of some or all of the structure and functions described above or shown in one or more or each of the Figures. These systems are formed from any combination of structure and function described herein or illustrated within the figures. In each of these systems and processes, the logic may be implemented in software or hardware. The hardware may be implemented through a processor or a controller accessing a local or remote volatile and/or non-volatile memory that interfaces peripheral devices or the memory through a wireless or a tangible medium.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:

1. A method of suppressing high-frequency perturbations in a pulse-width modulation comprising:
   pulse-width modulating a first electronic signal by superposing a first carrier signal having a carrier frequency and an input signal with a first modulation frequency to obtain a first pulse-width modulated signal;
   pulse-width modulating a second electronic signal by superposing a second carrier signal having the carrier frequency with another input signal with a second modulation frequency, where the second carrier signal is phase shifted with respect to the first carrier signal to obtain a second pulse-width modulated signal;
   filtering the first pulse-width modulated signal to obtain a first perturbed filtered signal and filtering the second pulse-width modulated signal to obtain a second perturbed filtered signal; and
   combining the first perturbed filtered signal and the second perturbed filtered signal using a high-pass filter, the high-pass filter is configured to combine the first perturbed filtered signal and the second perturbed filtered signal to obtain an output signal.

2. The method according to claim 1, where the steps of filtering the first pulse-width modulated signal to obtain the first perturbed filtered signal and filtering the second pulse-width modulated signal to obtain the second perturbed filtered signal are performed by low-pass filtering the first and second pulse-width modulated signals.

3. The method according to claim 1, where the second carrier signal is phase-shifted by 180° with respect to the first carrier signal.

4. The method according to claim 1, where:
   the second electronic signal is pulse-width modulated by superposing the second carrier signal having the carrier frequency and the input signal with the first modulation frequency, where the second carrier signal is phase shifted by 90° or 180° with respect to the first carrier signal to obtain the second pulse-width modulated signal;
   the first pulse-width modulated signal is filtered to obtain the first perturbed filtered signal and the second pulse-width modulated signal is filtered to obtain the second perturbed filtered signal; and
   the first perturbed filtered signal and the second perturbed filtered signal are combined to obtain the output signal.

5. The method according to claim 4, where the first pulse-width modulated signal and the second pulse-width modulated signal are low-pass filtered and where the low-pass filtered first pulse-width modulated signal and the low-pass filtered second pulse-width modulated signal are combined to obtain the output signal.

6. The method according to claim 1, where pulse-width modulating of the first and the second electronic signals comprises:

processing the first electronic signal in a first pulse-width modulation amplifier to obtain a first amplified pulse-width modulated signal;

processing the second electronic signal in a second pulse-width modulation amplifier to obtain a second amplified pulse-width modulated signal; and subsequently outputting the first amplified pulse-width modulated signal from first pulse-width modulation amplifier and the second amplified pulse-width modulated signal from the second pulse-width modulation amplifier before low-pass filtering and combining them to obtain the output signal.

7. Pulse-width modulation circuitry comprising:

a clock generation means configured to generate a first carrier signal with a carrier frequency and one or more second carrier signals with the carrier frequency, where the second carrier signals are, respectively, phase shifted by 360°/n, with respect to the first carrier signal where n is equal to the combined total number of signals by adding the number of the first carrier signal and the number of the second carrier signals;

a first pulse-width modulation means configured to receive an input signal and to pulse-width modulate the input signal with a first modulation frequency and by means of the first carrier signal and to output a first pulse-width modulated signal;

second pulse-width modulation means configured to receive another input signal and to pulse-width modulate the other input signal with a second modulation frequency and by means of the second carrier signals, respectively, and to output second pulse-width modulated signals;

filtering means configured to filter the first pulse-width modulated signal to obtain a first perturbed filtered signal and to filter the second pulse-width modulated signals to obtain second perturbed filtered signals where the filtering means comprises a first low-pass filtering means configured to low-pass filter the first pulse-width modulated signal to obtain the first perturbed filtered signal and one or more second low-pass filtering means configured to low-pass filter the second pulse-width modulated signals to obtain the second perturbed filtered signals;

a processing means configured to combine the first perturbed filtered signal and the second perturbed filtered signals to obtain an output signal where the processing means comprises a high-pass filter configured to combine the first perturbed filtered signal and the second perturbed filtered signals; and where the first low-pass filtering means and the second low-pass filtering means and the high-pass filter are designed to have identically decaying flanks for frequencies higher than the carrier frequency.

8. The circuitry according to claim 7, where the first pulse-width modulation means and each of the second pulse-width modulation means comprises a pulse-width modulation amplifier.

9. The circuitry according to claim 7, where the first pulse-width modulation means comprises a class D amplifier or a switch mode power supply amplifier.

10. The circuitry according to claim 7, where each of the second pulse-width modulation means comprises a class D amplifier or a switch mode power supply amplifier.

11. The circuitry according to claim 7 where the clock generation means, the first pulse-width modulation means, the second pulse-width modulation means, the filtering means, and the processing means are comprised as a unitary part within a nine-channel amplification means.

12. The circuitry according to claim 7 where the clock generation means, the first pulse-width modulation means, the second pulse-width modulation means, the filtering means, and the processing means are comprised as a unitary part within a vehicle.

* * * * *